US 6,355,106 B1

(12) United States Patent
Zheng et al.

(10) Patent No.: US 6,355,106 B1
(45) Date of Patent: Mar. 12, 2002

(54) DEPOSITION OF COPPER WITH INCREASED ADHESION

(75) Inventors: Bo Zheng, San Jose; Ling Chen, Sunnyvale; Alfred Mak, Union City; Mei Chang, Saratoga, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/706,321

(22) Filed: Nov. 3, 2000

Related U.S. Application Data

(62) Division of application No. 09/030,555, filed on Feb. 25, 1998, now Pat. No. 6,171,661.

(51) Int. Cl.[7] ............... C23C 16/00; B05D 3/06; G05B 15/00
(52) U.S. Cl. .......... 118/697; 118/696; 118/715; 700/1; 700/90; 700/95; 427/535; 427/533; 427/534; 427/252; 427/253
(58) Field of Search ............... 427/528, 531, 427/533, 534, 537, 539, 252, 253, 525; 118/715, 696, 697; 700/1, 90, 95, 266, 275, 301

(56) References Cited

U.S. PATENT DOCUMENTS

| 4,256,780 A | | 3/1981 | Gaerttner et al. ............ 427/38 |
| 4,673,587 A | | 6/1987 | Kamigaito et al. ........... 427/38 |
| 4,965,090 A | * | 10/1990 | Gärtner et al. .............. 427/569 |
| 5,096,737 A | * | 3/1992 | Baum et al. ................ 427/250 |
| 5,395,642 A | * | 3/1995 | Hamerich et al. .......... 427/252 |
| 5,449,799 A | * | 9/1995 | Terfloth et al. ............. 556/112 |
| 5,480,684 A | * | 1/1996 | Sundhu ...................... 427/530 |
| 5,561,082 A | * | 10/1996 | Matsuo et al. ............. 438/396 |
| 5,576,071 A | * | 11/1996 | Sandhu ..................... 427/534 |
| 5,654,245 A | * | 8/1997 | Allen ....................... 427/437 |
| RE35,614 E | * | 9/1997 | Norman et al. ............ 427/250 |
| 5,736,192 A | * | 4/1998 | Okamoto .................. 427/252 |
| 5,789,027 A | * | 8/1998 | Watkins et al. ............ 427/250 |
| 5,891,349 A | * | 4/1999 | Tobe et al. ................ 427/569 |
| 5,953,634 A | * | 9/1999 | Kajita et al. ............... 438/687 |
| 6,083,568 A | * | 7/2000 | Sandhu ..................... 427/533 |
| 6,171,661 B1 | * | 1/2001 | Zheng et al. .............. 427/535 |

FOREIGN PATENT DOCUMENTS

| EP | 0 461 032 A1 | 12/1991 | ......... C23C/14/48 |
| EP | 0 776 991 A1 | 6/1997 | ......... C23C/16/56 |

OTHER PUBLICATIONS

D. Manger, G. Braeckelmann, S–C Seo, S. Baesor, S. Nijsten, T. Happ, K. Kumar, A. Kaloyeros, "Microstructure Effects in MOCVD Copper for ULSI Metallization", VMIC Conference, Jun. 10–12, 1997.

C. Marcadal, E. Richard J. Torres, J. Palleau, R. Madar, "CVD Process of Copper Interconnection", Proceeding 1996 13th VMIC (1996) 174.

A. Jain,K–M. Chi,T.T. Kodas,M.J. Hampden–Smith, "Chemical Vapor Deposition of Cooper from Hexafluoroacetylacetonato Copper (1) Vinyltrimethylsilane", J. of Electrochemical Soc.,vol 140,No. 5,May 1993,pgs. 1434–1438.

M. Bai, X. Zhang, "Ion Beam Mixing Modification of Sputter–Deposied Molybdenum Films on $Si_3N_4$ Ceramics", (PCT 206) 2194 Thin Solid Films, vol. 249, No. 2, Sep. 15, 1994.

(List continued on next page.)

*Primary Examiner*—Jeffrie R. Lund
(74) *Attorney, Agent, or Firm*—Moser, Patterson & Sheridan, LLP

(57) ABSTRACT

A method and apparatus for improving the adhesion of a copper layer to an underlying layer on a wafer. The layer of copper is formed over a layer of material on a wafer and the copper layer impacted with ions to improve its adhesion to the underlying layer.

24 Claims, 4 Drawing Sheets

OTHER PUBLICATIONS

A.E. Berkowitz, R.E. Benenson, R.L. Fleischer, L. Wielunski, W. A. Lanford, "Ion–Beam–Enhanced Adhesion of Au Films in Si and $SiO_2$", Nuclear Inst. & Methods in Physics Research, vol. B07/8, No. 1, Part 2, Mar. 1, 1985, pp.

G. Cheng, S. Xu, D. Ye, "Adhesion Modification in (Cu, Nb, Ti)/$SiO_2$ Pairs by Argon Ion Bombardment", Nuclear Instruments and Methods in Physics Research B 135 (1998) pp. 545–549.

* cited by examiner

DEPOSITION OF COPPER WITH INCREASED ADHESION

CROSS REFERENCE TO RELATED APPLICATION

This application is a divisional of U.S. patent application Ser. No. 09/030,555 filed Feb. 25, 1998, now U.S. Pat. No. 6,171,661 which is herein incorporated by reference.

BACKGROUND OF THE INVENTION

1. Field of the Invention

The present invention is directed toward the field of manufacturing integrated circuits.

2. Description of the Related Art

Presently, aluminum is widely employed in integrated circuits as an interconnect, such as plugs and wires. However, higher device densities, faster operating frequencies, and larger die sizes have created a need for a metal with lower resistivity than aluminum to be used in interconnect structures. The lower resistivity of copper makes it an attractive candidate for replacing aluminum.

One challenge in employing copper instead of aluminum is the fact that copper dry etching is not presently feasible. A polishing process, such as chemical mechanical polishing, is used to remove undesirable portions of a deposited layer of copper. The need to use chemical mechanical polishing presents a challenge, because copper has poor adhesion to materials that are presently being used as diffusion barriers beneath the copper. The polishing of copper that is deposited over a diffusion barrier can therefore result in portions of the copper being undesirably peeled away from the surface of the diffusion barrier. This can render an integrated circuit defective.

When depositing copper, it is desirable to employ chemical vapor deposition ("CVD"), as opposed physical vapor deposition, because CVD provides for a more conformal layer of copper. However, the chemical vapor deposition of copper presents a further challenge. The challenge arises from a byproduct that is produced during the deposition of the copper.

In one instance, the chemical vapor deposition of copper is achieved by using a precursor known as Cupraselect, which has the formula Cu(hfac)L. The L represents a Lewis base compound, such as vinyltrimethylsilane ("VTMS"). The (hfac) represents hexafluoroacetylacetonato, and Cu represents copper. During the CVD of copper using the Cu(hfac)L precursor, the precursor is vaporized and flowed into a deposition chamber containing a wafer. In the chamber, the precursor is infused with thermal energy at the wafer's surface, and the following reaction results:

$$2\,Cu(hfac)L \rightarrow Cu + Cu(hfac)_2 + 2L \qquad \text{(Eqn. 1)}$$

The resulting copper (Cu) deposits on the upper surface of the wafer, along with the Cu(hfac)$_2$ byproduct. The gaseous Lewis base byproduct (2L) is purged from the chamber. The presence of the byproduct as well as other contaminants on the wafer's surface reduces the adhesion of the copper to an underlying diffusion barrier, such as tantalum nitride.

In order to improve the adhesion of copper to an underlying diffusion barrier, the process for depositing copper has been divided into two steps. During a first step, physical vapor deposition (PVD) is performed to deposit a seed layer of copper. In PVD, a copper target is placed above a substrate onto which the copper is to be deposited. An argon gas is introduced into the environment between the copper target and the substrate. The argon gas is then excited through the use of a radio frequency ("RF") signal to create a plasma containing ions.

The ions from the plasma strike the copper target, thereby dislodging particles of the copper which deposit on the substrate. These copper particles are generally ionized and thus are highly energetic. Such energetic copper ions adhere well to the barrier layers. The substrate is biased so that a voltage gradient forms between the target and the substrate, thereby causing the copper ions to accelerate along the gradient and bombard the substrate. As a result of the bombardment, the copper particles strongly adhere to the surface of the substrate. Secondly, this PVD process provides a clean interface between the copper seed layer and the barrier layer.

Once the seed layer of copper is deposited using PVD, a bulk layer of copper is deposited. The bulk layer is deposited by either standard chemical vapor deposition or electrical plating. The bulk layer of copper adheres relatively well to the copper seed layer.

However, the use of the PVD process results in poor step coverage, which is unacceptable for devices that have small features. Further, the PVD process cannot be accomplished in the same chamber as either chemical vapor deposition or electrical plating. The need to have both a PVD chamber and either a CVD or electrical plating chamber increases integrated circuit manufacturing costs.

Accordingly, it is desirable to provide for the conformal chemical vapor deposition of copper onto a diffusion barrier, so that the adhesion between the copper and underlying diffusion barrier is improved. It is also desirable for such a deposition to be performed in a single chamber (in situ). It is further desirable to decrease the production of contaminant byproducts during the deposition of copper, so that the deposition can be performed faster and with a smaller amount of precursor.

SUMMARY OF THE INVENTION

In accordance with the present invention, a layer of material, such as copper, is formed on the surface of a wafer with improved adhesion. In forming the layer of copper, a copper seed layer is first deposited on a surface of the wafer. Once the seed layer is deposited, the copper is bombarded (annealed) with ions to improve the adhesion of the copper to the surface of the wafer.

More specifically, ions in a plasma of an inert gas bombard the copper to provide the improved adhesion, which results in the copper being "mounted" on the surface of the wafer. This mounting increases the adhesion of the copper to the wafer's surface. Additionally, such bombardment flattens the copper grains to improve charge mobility. The plasma is generated in one embodiment of the present invention using an inert gas, such as argon. Alternatively, hydrogen can be employed along with an inert gas to generate a plasma for bombarding the copper as well as providing for contaminant removal. The addition of the hydrogen provides for the removal of copper deposition byproducts such as carbon, oxygen, fluorine and the like, thereby enhancing the adhesion of the copper to the barrier layer.

BRIEF DESCRIPTION OF THE DRAWINGS

Further details of the present invention are explained with the help of the attached drawings in which.

DETAILED DESCRIPTION

Figure 1:
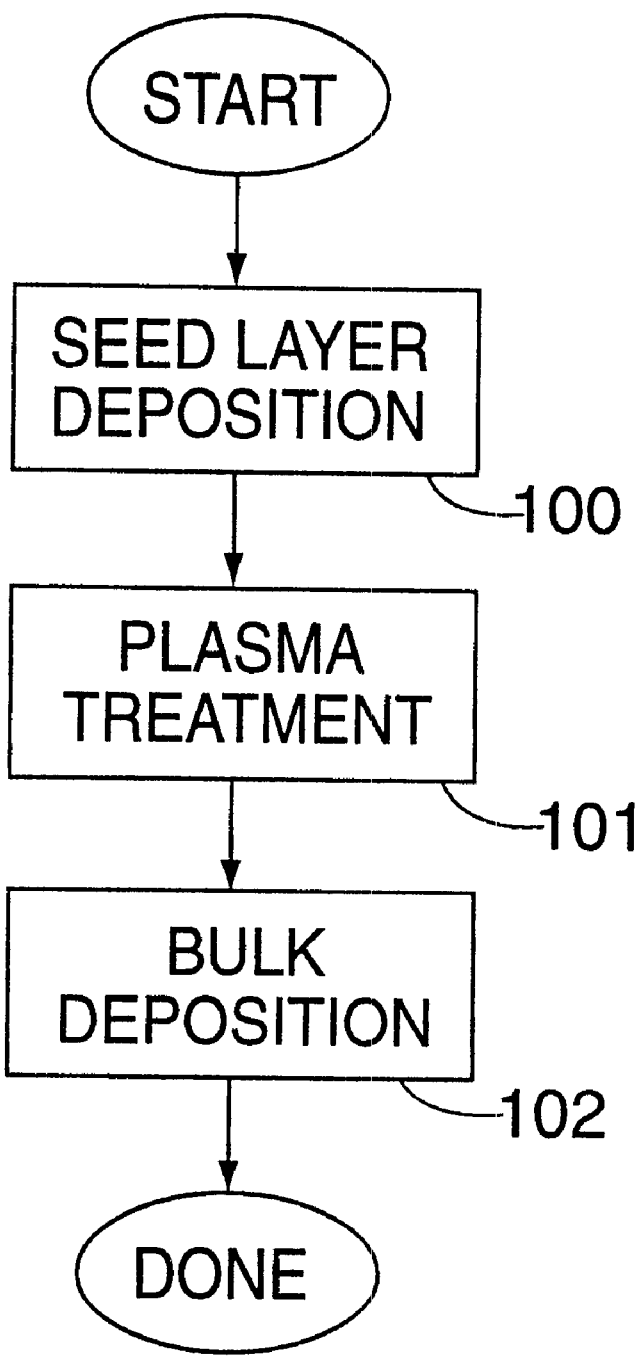
FIG. 1 illustrates a sequence of operations that are performed for depositing a layer of copper in accordance with the present invention.

FIG. 1 illustrates a sequence of operations for depositing copper on the surface of a wafer in accordance with the present invention. First, a seed layer of copper is deposited on the upper surface of the wafer in step 100. The seed layer of copper is deposited using chemical vapor deposition and can be deposited as either a continuous or discontinuous layer of copper. In accordance with the present invention, a Cu(hfac)L precursor is employed in the deposition of the seed layer. However, other copper precursors in combination with reducing agents could be used to form the seed layer, e.g., $Cu^{+2}$(hfac)L precursor with a hydrogen reducing agent.

Once the seed layer of copper is deposited, in step 101, the seed layer is treated with a plasma. The plasma is generated by applying RF energy to one or more gases. In one embodiment of the present invention, the plasma gas is composed of only a single gas, such as argon, krypton or xenon. In an alternate embodiment of the present invention, the gaseous mixture includes multiple gases, such as a combination of argon and hydrogen; krypton and hydrogen; or xenon and hydrogen.

During plasma treatment, the substrate onto which the copper has been deposited acquires a bias. The bias results in ions in the plasma being accelerated toward the substrate. These ions impact the copper seed layer, thereby causing the copper to adhere to the surface of the substrate, i.e., the copper grains become "mounted" on the substrate and also flattens the grains to improve charge mobility. This enhances the adhesion of the copper seed layer to the substrate. Also, if hydrogen ions are present in the plasma, they combine with precursor contaminant byproducts and are removed from the chamber.

Once the plasma treatment is completed in step 101, a bulk deposition of copper is performed in step 102. The copper deposited during the bulk deposition is deposited over the plasma treated copper to form a layer of copper having a desired thickness and improved adhesion to the wafer's surface. The bulk deposition is achieved using a chemical vapor deposition with Cu(hfac)L or some other bulk copper deposition process.

In one embodiment of the present invention, the copper seed layer deposition, plasma treatment, and bulk deposition are accomplished in a single chamber that is capable of performing both chemical vapor deposition and plasma treatment. Accordingly, the layer of copper is formed completely in situ. In further embodiments of the present invention, the chemical vapor depositions and plasma treatment are performed in different chambers.

Figure 2A:
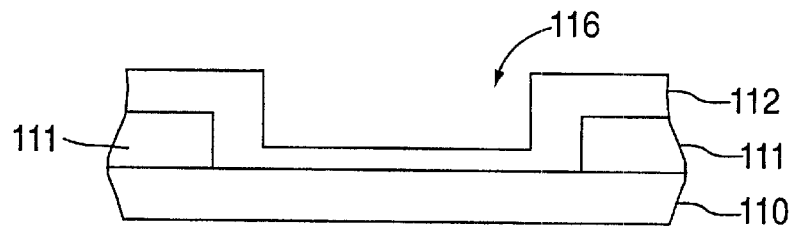
FIGS. 2(a)–2(d) illustrate the deposition of a layer of copper in accordance with the present invention.

FIGS. 2(a)–2(d) illustrate the formation of a layer of copper in an integrated circuit in accordance with the present invention. FIG. 2(a) shows a via 116 that has been formed (i.e., etched) in a layer 111 of insulative material, such as silicon dioxide. The layer 111 of insulative material overlies a substrate 110 which is to be electrically coupled to other elements in the integrated circuit. The substrate 110 is to be coupled to the other elements by an interconnect structure that will be formed within the via 116.

The upper surface of the insulative layer 111 of material and the upper surface of the substrate 110 that is within the perimeter of the via 116 are overlain by a diffusion barrier 112. The diffusion barrier 112 is employed to inhibit the diffusion of interconnect structure metal into the substrate 110. In one embodiment of the present invention, the interconnect structure metal is copper, and the diffusion barrier is a refractory metal or refractory metal nitride. For example, the refractory metal nitride is preferably tantalum nitride, but may also be titanium nitride, tantalum, tungsten nitride or another suitable material that functions as a diffusion barrier between the metal (e.g., copper) and the substrate 110.

Figure 2B:
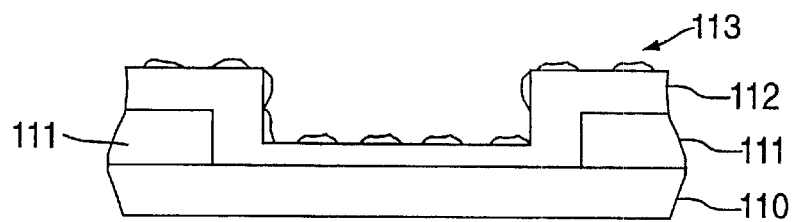

FIG. 2(b) illustrates the deposition of a seed layer 113 of copper which is to be employed in an interconnect structure. The seed layer of copper 113 is deposited on the upper surface of the diffusion barrier 112 using chemical vapor deposition. In one embodiment of the present invention, as shown in FIG. 2(b), the seed layer 113 of copper is deposited to be discontinuous, i.e., there are gaps between deposition regions. In an alternate embodiment (not shown) the seed layer 113 of copper is deposited to be continuous with a thickness in a range of 10 Å to 300 Å. The thickness of the seed layer depends upon the plasma treatment parameters used to treat the seed layer. Thus, the thickness of the deposition should conform to the chosen treatment parameters.

The chemical vapor deposition of the seed layer 113 is preferably achieved using the Cu(hfac)L precursor, with L being VTMS. Liquid Cu(hfac)L is vaporized and flowed into the environment containing the diffusion barrier 112. Vaporization of the precursor can be accomplished by "bubbling" nitrogen or hydrogen through the liquid precursor. The vaporized precursor is provided to the environment at a flow rate of approximately 0.1 to 1 SCCM. The environment is controlled so that it has a pressure in the range of 0.5 mTorr to 1.5 mTorr, and the temperature of the substrate is in a range of 150 to 250° C. The deposition process is carried out for a time period in the range of 30 seconds to 5 minutes depending upon the desired thickness of the seed layer. The seed layer may be chemically deposited using other copper precursors such as $Cu^{+2}$(hfac)$_2$ with a hydrogen reducing agent. Broadly speaking, any form of copper deposition is considered to be within the scope of the invention.

Figure 2C:
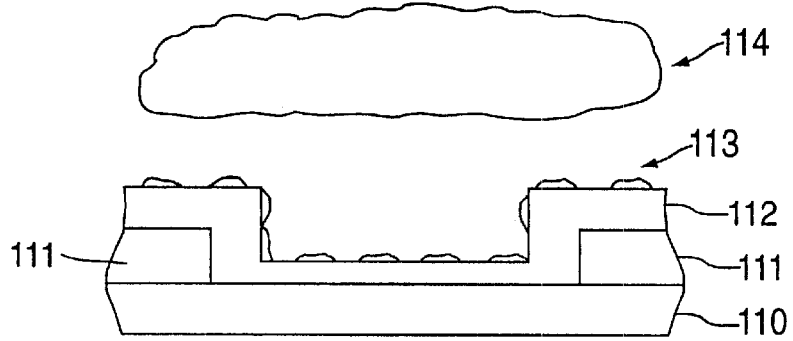
Figure 2D:
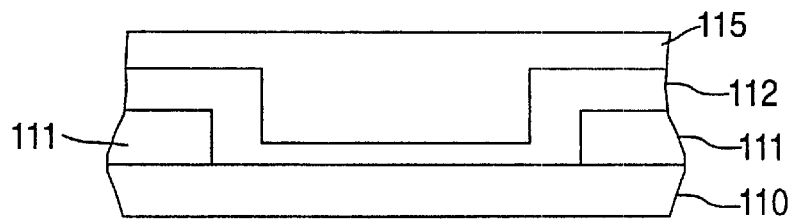

Once the seed layer of copper 113 is deposited, it is treated with a plasma 114, as shown in FIG. 2(c). In accordance with the present invention, the plasma 114 is formed by providing energy to one or more gases, i.e., a gaseous mixture, that includes an inert gas with an atomic mass that is similar to the atomic mass of copper. Such gases include argon, xenon and krypton. In one embodiment of the present invention, the gaseous mixture is composed of argon.

When argon is employed, an argon gas is flowed into the environment containing the seed layer of copper 113 at a flow rate in the range of 100 to 500 sccm. The argon gas is transformed into a plasma by infusing it with energy from a RF signal having a frequency in the range of 100 kHz–20 MHz, where 13.56 MHz has been found to produce sufficient treatment results using a RF power level in the range of 100 watts to 2000 watts. Generally speaking, the higher the power that is applied to the plasma the better the treatment of the seed layer. The resulting plasma 114 is maintained for a time period in the range of 10 to 60 seconds.

When performing the plasma treatment, the environment of the seed layer of copper 113 is controlled so that the pressure is in a range of 0.1 to 1.5 Torr, and the temperature of the substrate 110 is set to be in a range of 150 to 250° C.

As the plasma 114 is formed, the argon becomes ionized. The resulting ions of argon accelerate towards and impact the seed layer 113 of copper. The impact from the ions causes the impacted copper layer 113 to have improved bonding with the diffusion barrier 112. This "mounting" of the copper material on the diffusion barrier 112 improves the adhesion of the copper seed layer 113 to the diffusion barrier 112.

In an alternate embodiment of the present invention, the plasma 114 is formed from a gaseous mixture that is a mixture of hydrogen with an inert gas, such as argon, krypton or xenon. When argon is employed, the ratio of argon to hydrogen is in a range of 1:1 to 3:1. The plasma is formed from the gaseous mixture of argon and hydrogen by providing energy to the gas in the same manner as forming a plasma of only argon.

As described above, the chemical vapor deposition of copper using the Cu(hfac)L precursor results in the deposition of copper along with a contaminant (hfac) byproduct. This contaminant byproduct adversely affects the adhesion of the copper 113 to the diffusion barrier 112. The addition of the hydrogen to the plasma 114 results in the elimination of a portion of (hfac) byproduct as well as other contaminants such as fluorine, oxygen, and/or carbon.

When the argon-hydrogen plasma 114 is employed, the argon ions impact the copper 113, as described above, and the hydrogen combines with (hfac) byproduct according to the following equation:

$$H_2 + (hfac) \rightarrow 2H(hfac) \qquad \text{(Eqn. 2)}$$

The 2H(hfac) is a gaseous byproduct of the reaction and is exhausted from the environment in which the seed layer 113 is deposited. As a result of the employing the argon-hydrogen plasma 114, the adhesion of the seed layer 113 to the diffusion barrier 112 is improved by two mechanisms. The first mechanism is the bombardment of the copper by the argon ions to improve the bond between the copper and the diffusion barrier 112. The second mechanism is the elimination of (hfac) contaminant byproduct and/or other contaminants that will bond with hydrogen and be removed from the chambers.

In alternate embodiments of the present invention, the plasma 114 may be further altered, while still achieving the benefit of improving the adhesion between the copper seed layer 113 and underlying diffusion barrier 112. For example, other inert gases, such as krypton and xenon, can be substituted for the argon in the plasma 114. Such substitutions may be made whether or not hydrogen is employed. Further, the plasma 114 may be composed of only hydrogen. In such an embodiment, improved adhesion between the copper seed layer 113 and the diffusion barrier 112 results from the elimination of (hfac) byproduct and other contaminants that may interfere with copper bonding.

Once the seed layer of copper 113 is treated with the plasma 114, a bulk deposition of copper is performed to form the final copper layer 115 having a desired thickness. As shown in FIG. 2(*d*), the newly deposited copper is deposited using chemical vapor deposition and merges with (grows upon) the seed layer of copper 113 to form the final layer of copper 115. In a preferred embodiment of the invention, the bulk CVD of copper layer 115 is achieved as described above with respect to FIG. 2(*b*) using the Cu(hfac)L precursor; however, other bulk deposition processes may be used such as $Cu^{+2}(hfac)_z$ with a hydrogen reducing agent.

The bulk deposition of copper is accomplished until the final layer 115 of copper has a, thickness in a range of 1000 Å to 1 micron. Since the newly deposited copper is deposited on top of the seed layer 113, which has improved adhesion to the underlying diffusion barrier 112, the adhesion of the final layer of copper 115 to the diffusion barrier 112 is also improved. As a result of the improved adhesion, the copper is less likely to be undesirably peeled away from the diffusion barrier 112 during polishing.

Figure 3:
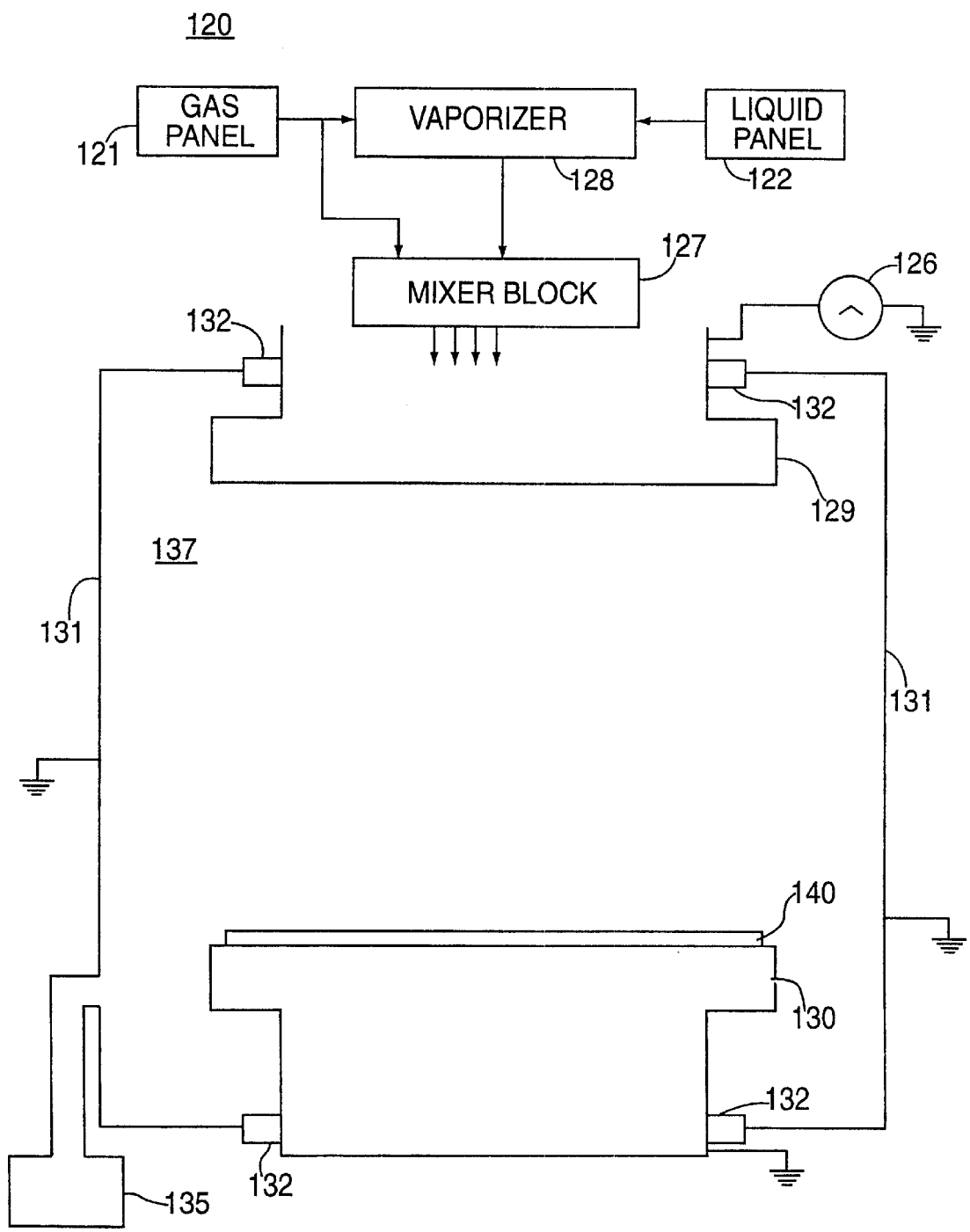
FIG. 3 illustrates a deposition chamber that is used in the deposition of copper in accordance with the present invention.

FIG. 3 illustrates a CVD system 120 that can be employed to form a layer of copper in accordance with the present invention. The chamber is a model WxZ chamber manufactured by Applied Materials, Inc. of Santa Clara, Calif., that has been modified to perform copper deposition in accordance with the invention. The system 120 includes a process chamber 137 in which copper deposition and plasma treatment is performed. Included in the process chamber 137 are a wafer support 130 for supporting a wafer and a showerhead 129 for flowing reactant gases into the process chamber 137.

The process chamber 137 is defined by a set of walls 131 that are electrically and thermally isolated from the wafer support 130 and showerhead 129 by isolators 132. For providing thermal energy, the wafer support 130 includes a resistive coil (not shown) that provides heat to the wafer support's surface. For providing the energy for forming a plasma, the showerhead 129 is coupled to a signal source 126 that provides signals having frequencies in a range of 100 kHz to 20 MHz. Both the processing chamber walls 131 and the wafer support 130 are coupled to ground.

A pressure control unit 135, e.g., a vacuum pump, is coupled to the process chamber 137 for setting the pressure in the process chamber 137. The pressure control unit 135 also provides for purging reactant byproducts from the process chamber.

In order to provide reactants to the process chamber 137, the system 120 also includes a mixer block 127, vaporizer 128, gas panel 121, and liquid panel 122. The gas panel 121 provides gaseous reactants and is coupled to both the vaporizer 128 and the mixer block 127. The liquid panel 122 provides liquid reactants and is coupled to the vaporizer 128.

The vaporizer 128 provides for converting liquid reactants into gaseous reactants. When a liquid reactant is employed, the liquid panel 122 provides the liquid reactant to the vaporizer 128, and the vaporizer 128 vaporizes the liquid and uses an inert dilutant gas such as helium, hydrogen, nitrogen or argon as a carrier gas. Alternatively, the vaporizer may produce a gaseous reactant through evaporation. When both gaseous and liquid reactants are employed, the gas panel 121 provides the vaporizer 128 with the gaseous reactants, and the liquid panel 122 provides the vaporizer 128 with the liquid reactants. The vaporizer then provides for the combination and vaporization of these reactants. The mixer block 127 is coupled to pass gaseous reactants from the gas panel 121 and vaporizer 128 to the showerhead 129.

The formation of the layer of copper is carried out in situ in a single processing system such as that shown in FIG. 3. A wafer 140 containing an upper surface on which copper is to be deposited is placed in the process chamber 137 on wafer support 130, which is spaced approximately 350 mils from a showerhead 129. In one embodiment of the present invention, the upper surface of the wafer 140 is a diffusion barrier that is formed by a refractory metal nitride, such as titanium nitride, tantalum nitride or tungsten nitride. The wafer (substrate) is then processed as described above.

Figure 4:
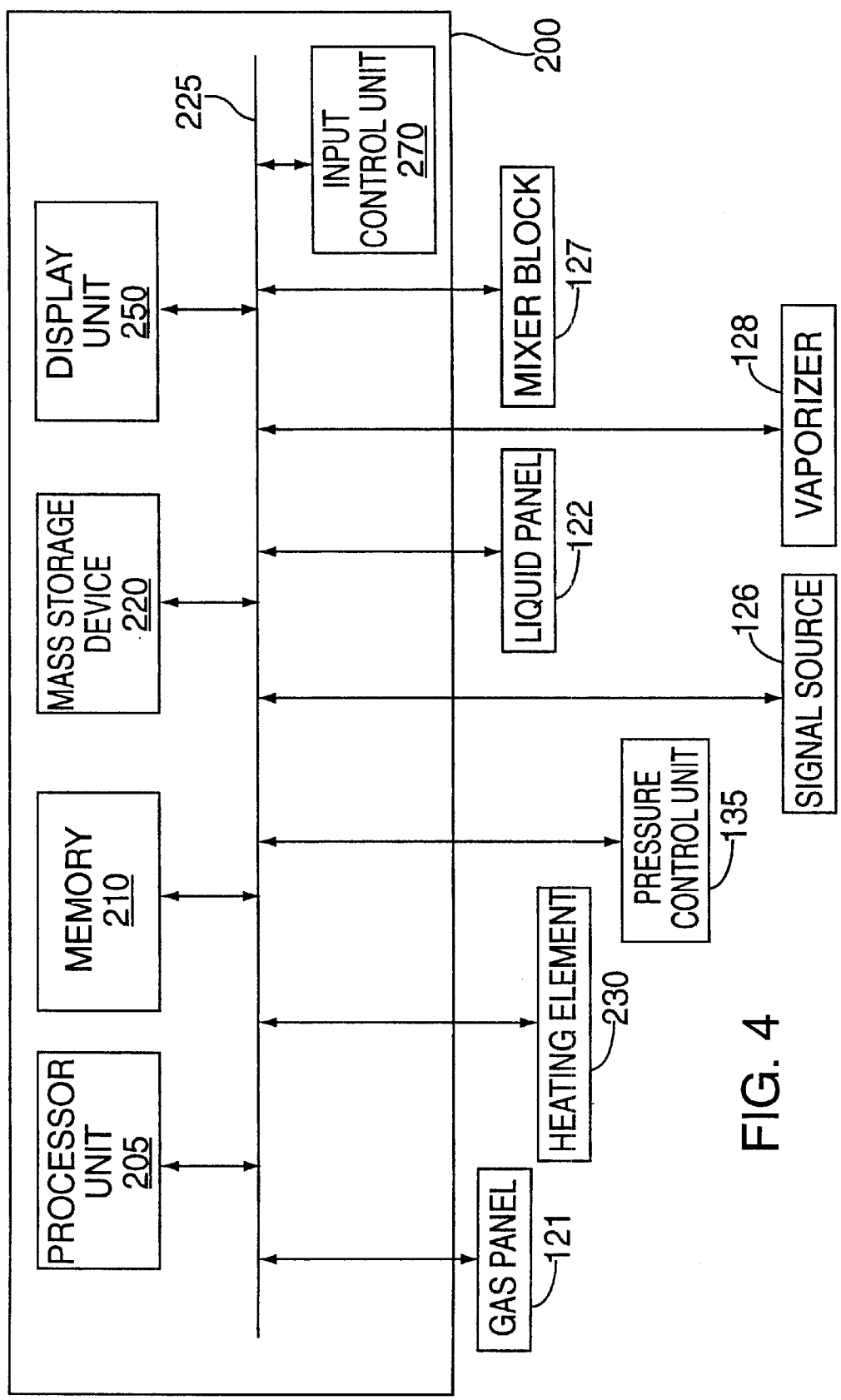
FIG. 4 illustrates a control system that is employed in accordance with the present invention to control the operation of a deposition chamber that is used for depositing copper in accordance with the present invention.

The above-described process steps (FIGS. 2(*a*) through 2(*d*)) for forming a layer of copper can be performed in a system that is controlled by a processor based control unit. FIG. 4 shows a control unit 200 that can be employed in such a capacity. The control unit includes a processor unit 205, a memory 210, a mass storage device 220, an input control unit 270, and a display unit 250 which are all coupled to a control unit bus 225.

The processor unit 205 is either a microprocessor or other engine that is capable of executing instructions stored in a memory. The memory 210 can be comprised of a hard disk drive, random access memory ("RAM"), read only memory ("ROM"), a combination of RAM and ROM, or another processor readable storage medium. The memory 210 contains instructions that the processor unit 205 executes to facilitate the performance of the above mentioned process steps. The instructions in the memory 210 are in the form of program code. The program code may conform to any one of a number of different programming languages. For example, the program code can be written in C+, C++, BASIC, Pascal, or a number of other languages.

The mass storage device 220 stores data and instructions and retrieves data and program code instructions from a processor readable storage medium, such as a magnetic disk or magnetic tape. For example, the mass storage device 220 can be a hard disk drive, floppy disk drive, tape drive, or optical disk drive. The mass storage device 220 stores and retrieves the instructions in response to directions that it receives from the processor unit 205. Data and program code instructions that are stored and retrieved by the mass storage device 220 are employed by the processor unit 205 for performing the above mentioned process steps. The data and program code instructions are first retrieved by the mass storage device 220 from a medium and then transferred to the memory 210 for use by the processor unit 205.

The display unit 250 provides information to a chamber operator in the form of graphical displays and alphanumeric characters under control of the processor unit 205. The input control unit 270 couples a data input device, such as a keyboard, mouse, or light pen, to the control unit 200 to provide for the receipt of a chamber operator's inputs.

The control unit bus 225 provides for the transfer of data and control signals between all of the devices that are coupled to the control unit bus 225. Although the control unit bus is displayed as a single bus that directly connects the devices in the control unit 200, the control unit bus 225 can also be a collection of busses. For example, the display unit 250, input control unit 270 and mass storage device 220 can be coupled to an input-output peripheral bus, while the processor unit 205 and memory 210 are coupled to a local processor bus. The local processor bus and input-output peripheral bus are coupled together to form the control unit bus 225.

The control unit 200 is coupled to the elements of the chamber in FIG. 3 that are employed in forming a layer of copper in accordance with the present invention. Each of these elements is coupled to the control unit bus 225 to facilitate communication between the control unit 200 and the element. These elements include the following: the gas panel 121, the liquid panel 122, a heating element 230, such as the resistive coil (not shown)in the wafer support, the pressure control unit 135, the signal source 126, the vaporizer 128, and the mixer block 127. The control unit 200 provides signals to the chamber elements that cause the elements to perform the operations described above for the process steps of forming a layer of copper.

In operation, the processor unit 205 directs the operation of the chamber elements in response to the program code instructions that it retrieves from the memory 210. In response to these instructions, the chamber elements are directed to perform the process steps described above with reference to FIG. 1.

Once a wafer is placed in the processing chamber, a seed layer of copper is deposited on the wafer in step 100 (FIG. 1). In order to perform the deposition in step 100, the processor unit 205 executes instructions retrieved from the memory 210. The execution of these instructions results in the elements of the chamber being operated to deposit a layer of material on a substrate as described above with reference to FIG. 2(b).

Once the seed layer of copper is deposited, instructions retrieved from the memory 210 instruct the processor unit 205 to cause the elements of the chamber 120 to perform a plasma treatment in step 101. The execution of these instructions results in the elements of the chamber 120 being operated to treat the deposited copper with a plasma as described above with reference to FIG. 2(c).

Once the plasma treatment is completed, instructions retrieved from the memory 210 instruct the processor unit 205 to cause the elements of the chamber 120 to perform a bulk deposition of copper in step 102. The execution of these instructions results in the elements of the chamber 120 being operated to perform a bulk deposition to treat the copper as described above with reference to FIG. 2 (d).

Although the present invention has been described in terms of specific exemplary embodiments, it will be appreciated that various modifications and alterations might be made by those skilled in the art without departing from the spirit and scope of the invention as specified by the following claims.

What is claimed is:

1. In a semiconductor wafer processing system containing a chamber for performing chemical vapor deposition and a computer for controlling the chemical vapor deposition within the chamber, a computer readable medium containing a program that, when executed by the computer, causes the semiconductor wafer processing system to perform a method comprising:

(a) chemical vapor depositing a seed layer consisting essentially of copper upon a substrate; and (b) after the step (a), treating the copper seed layer through ion bombardment to cause the copper seed layer to adhere to an upper surface of the substrate.

2. The computer readable medium of claim 1, wherein the step (b) includes the step of:

forming a plasma, wherein the plasma includes ions that bombard the copper seed layer.

3. The computer readable medium of claim 2, wherein the plasma is formed using an inert gas.

4. The computer readable medium of claim 3, wherein the inert gas is one or more gases selected from a group consisting of argon, krypton, and xenon.

5. The computer readable medium of claim 3 wherein the inert gas is combined with hydrogen.

6. The computer readable medium of claim 2, wherein the plasma is formed using hydrogen.

7. The computer readable medium of claim 1 wherein the copper seed layer is deposited in a continuous layer.

8. The computer readable medium of claim 1 wherein the copper seed layer is deposited in a discontinuous layer.

9. The computer readable medium of claim 1, wherein the substrate contains a diffusion barrier.

10. The computer readable medium of claim 9, wherein the diffusion barrier is composed of a refractory metal, or refractory metal nitride.

11. The computer readable medium of claim 10, wherein the diffusion barrier is a material selected from a group consisting of tantalum, titanium nitride, tantalum nitride, and tungsten nitride.

12. The computer readable medium of claim 1, wherein the method further includes the step of:
   (c) depositing additional copper upon the copper seed layer deposited in the step (a) and treated in the step (b).

13. The computer readable medium of claim 12, wherein the additional copper deposited in the step (c) combines with the copper seed layer deposited in the step (a) to form a continuous layer of copper.

14. The computer readable medium of claim 13, wherein steps (a), (b) and (c) are all performed in a processing chamber, and the substrate is not removed from the processing chamber until steps (a), (b) and (c) have all been completed.

15. The computer readable medium of claim 1, wherein the chemical vapor deposition is accomplished using a chemical compound having a formula of Cu(hfac)L; where Cu represents copper, hfac represents hexafluoroacetylacetonato, and L represents a Lewis base compound.

16. In a semiconductor wafer processing system containing a chamber for performing chemical vapor deposition and a computer for controlling the chemical vapor deposition within the chamber, a computer readable medium containing a program that, when executed by the computer, causes the semiconductor wafer processing system to perform a method comprising:
   (a) placing a wafer in the processing chamber;
   (b) chemical vapor depositing a seed layer consisting essentially of copper on a layer of material, while the wafer is in the processing chamber; and
   (c) after the step (b), treating the copper seed layer through ion bombardment to cause the copper seed layer to adhere to an upper surface of the layer of material, while the wafer is in the processing chamber.

17. The computer readable medium of claim 16, wherein the step (c) includes the step of:
   forming a plasma, wherein the plasma includes ions that impact the copper seed layer.

18. The computer readable medium of claim 17, wherein the plasma is formed using a gaseous mixture that includes an inert gas.

19. The computer readable medium of claim 18, wherein the inert gas is a gas selected from a group consisting of argon, krypton, and xenon.

20. The computer readable medium of claim 18, wherein the gaseous mixture includes at least one gas selected from a group consisting of argon, krypton, xenon, and hydrogen.

21. The computer readable medium of claim 17, wherein the plasma is formed using hydrogen.

22. The computer readable medium of claim 16, wherein the layer of material is a diffusion barrier.

23. The computer readable medium of claim 16, wherein the method further includes:
   (d) depositing additional copper on the copper seed layer treated in the step (c), while the wafer is in the processing chamber.

24. The computer readable medium of claim 23, wherein the chemical vapor deposition is accomplished using a chemical compound having a formula of Cu(hfac)L; where Cu represents copper, hfac represents hexafluoroacetylacetonato, and L represents a Lewis base compound.

* * * * *

UNITED STATES PATENT AND TRADEMARK OFFICE
CERTIFICATE OF CORRECTION

PATENT NO.    : 6,355,106 B1
DATED         : March 12, 2002
INVENTOR(S)   : Zheng et al.

It is certified that error appears in the above-identified patent and that said Letters Patent is hereby corrected as shown below:

<u>Title page,</u>
Item [56], OTHER PUBLICATIONS, line 4, please replace "pp." with -- pp. 877-880 --.
Item [56], OTHER PUBLICATIONS, line 5, please insert a -- , -- after "Richard".
Item [56], OTHER PUBLICATIONS, line 9, please replace "Cooper" with -- Copper --.
Item [56], OTHER PUBLICATIONS, line 13, please replace "Sputter-Deposied" with -- Sputter-Deposited --.

<u>Column 5,</u>
Line 67, please delete "," after "a".

Signed and Sealed this

Twentieth Day of August, 2002

*Attest:*

*Attesting Officer*

JAMES E. ROGAN
*Director of the United States Patent and Trademark Office*